US010388491B2

(12) United States Patent
Kodaira et al.

(10) Patent No.: US 10,388,491 B2
(45) Date of Patent: Aug. 20, 2019

(54) ION BEAM ETCHING METHOD OF MAGNETIC FILM AND ION BEAM ETCHING APPARATUS

(71) Applicant: CANON ANELVA CORPORATION, Kanagawa (JP)

(72) Inventors: Yoshimitsu Kodaira, Kanagawa (JP); Tomohiko Toyosato, Kanagawa (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 803 days.

(21) Appl. No.: 14/351,341

(22) PCT Filed: Oct. 24, 2012

(86) PCT No.: PCT/JP2012/077398

§ 371 (c)(1),
(2) Date: Apr. 11, 2014

(87) PCT Pub. No.: WO2013/065531

PCT Pub. Date: May 10, 2013

(65) Prior Publication Data

US 2014/0251790 A1 Sep. 11, 2014

(30) Foreign Application Priority Data

Oct. 31, 2011 (JP) ................................ 2011-238370
Jul. 25, 2012 (JP) ................................ 2012-164516

(51) Int. Cl.
*H01J 37/305* (2006.01)
*H01J 37/32* (2006.01)
(Continued)

(52) U.S. Cl.
CPC ............ *H01J 37/3056* (2013.01); *C23F 4/00* (2013.01); *H01F 41/34* (2013.01); *H01J 37/305* (2013.01);
(Continued)

(58) Field of Classification Search
CPC ............. H01J 37/3056; H01J 37/32798; H01J 37/3288; G11B 5/3163
See application file for complete search history.

(56) References Cited

U.S. PATENT DOCUMENTS 5,455,061 A * 10/1995 Matossian ............... C23C 14/22 204/192.33
5,525,392 A * 6/1996 Baum ................... G11B 5/725 427/131

(Continued)

FOREIGN PATENT DOCUMENTS

JP 60-246546 A 12/1985
JP 4-249319 A 9/1992

(Continued)

OTHER PUBLICATIONS

Machine Translation to Tatsumi (JP 2004-356179 as cited on IDS) published Dec. 2004.*

(Continued)

*Primary Examiner* — John J Brayton
(74) *Attorney, Agent, or Firm* — Venable LLP

(57) ABSTRACT

To restrict generation of particles or deterioration in process reproducibility caused by a large amount or carbon polymers generated in a plasma generation portion in an ion beam etching apparatus when a magnetic film on a substrate is etched with reactive ion beam etching in manufacturing a magnetic device. In an ion beam etching apparatus, first carbon-containing gas is introduced by a first gas introduction part into a plasma generation portion, and second carbon-containing gas is additionally introduced by a second gas introduction part into a substrate processing space to perform reactive ion beam etching, thereby etching a magnetic material at preferable selection ratio and etching rate while restricting carbon polymers from being formed in the plasma generation portion.

6 Claims, 5 Drawing Sheets

(51) Int. Cl.

| | |
|---|---|
| ***C23F 4/00*** | (2006.01) |
| ***H01F 41/34*** | (2006.01) |
| ***H01L 43/08*** | (2006.01) |
| ***H01L 43/12*** | (2006.01) |

(52) U.S. Cl.

CPC .... *H01J 37/3288* (2013.01); *H01J 37/32798* (2013.01); *H01L 43/08* (2013.01); *H01L 43/12* (2013.01)

(56) References Cited

U.S. PATENT DOCUMENTS

| | | | | |
|---|---|---|---|---|
| 7,034,285 | B2 | 4/2006 | Ichiki et al. | |
| RE40,951 | E | 11/2009 | Kodaira et al. | |
| 8,329,593 | B2 | 12/2012 | Yousif et al. | |
| 2002/0038681 | A1 | 4/2002 | Nakatani et al. | |
| 2003/0038106 | A1 * | 2/2003 | Covington | B82Y 25/00 216/2 |
| 2004/0222367 | A1 | 11/2004 | Ichiki et al. | |
| 2007/0119811 | A1 | 5/2007 | Nakatani et al. | |
| 2008/0073586 | A1 * | 3/2008 | Iwasaki | G01N 23/2251 250/492.21 |
| 2008/0085604 | A1 | 4/2008 | Hoshino et al. | |
| 2008/0277377 | A1 | 11/2008 | Nakatani et al. | |
| 2009/0156013 | A1 | 6/2009 | Yousif et al. | |
| 2011/0100954 | A1 | 5/2011 | Satake et al. | |

FOREIGN PATENT DOCUMENTS

| | | | |
|---|---|---|---|
| JP | 8-264519 | A | 10/1996 |
| JP | 9-82494 | A | 3/1997 |
| JP | 10-330970 | A | 12/1998 |
| JP | 2002-38285 | A | 2/2002 |
| JP | 2004-281232 | A | 10/2004 |
| JP | 2004-356179 | A | 12/2004 |
| JP | 2005-527101 | A | 9/2005 |
| JP | 2009-188344 | A | 8/2009 |
| TW | 200608489 | A | 3/2006 |
| TW | 200943411 | A | 10/2009 |
| WO | 2006/004224 | A1 | 1/2006 |

OTHER PUBLICATIONS

Full English Translation of Taiwanese office action in corresponding application No. 101139247 dated Feb. 24, 2015 (6 pages).

Notice of Preliminary Rejection dated May 27, 2015 in Korean Application No. 10-2014-7006127 (5 pages).

Notice of Reasons For Rejection dated Aug. 18, 2015 in Japanese Patent Application No. 2014-251706 (3 pages).

International Preliminary Report on Patentability issued in International Application No. PCT/JP2012/077398, dated May 15, 2014 (6 pages).

* cited by examiner

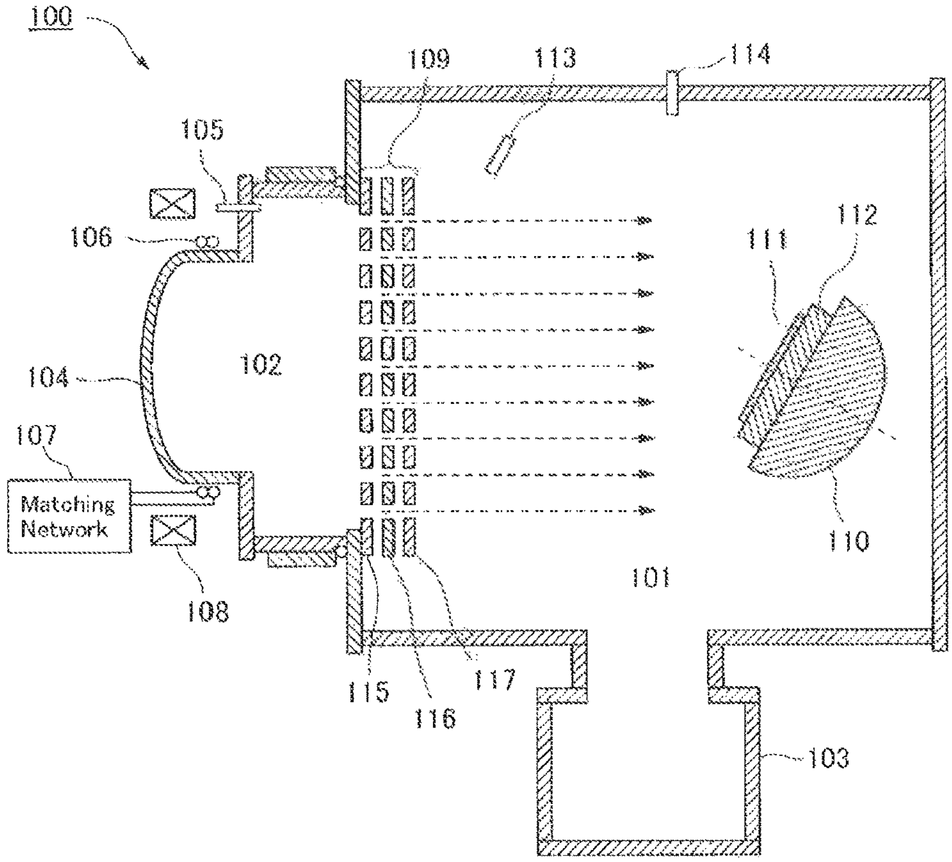
F I G. 1
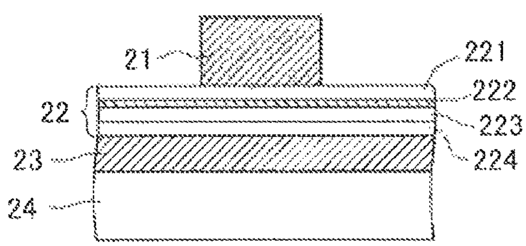
F I G. 2A
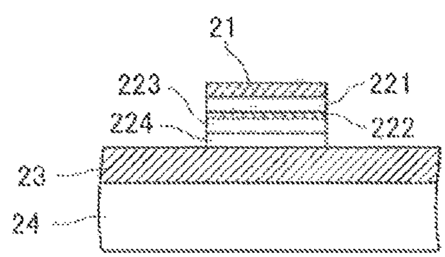
F I G. 2B

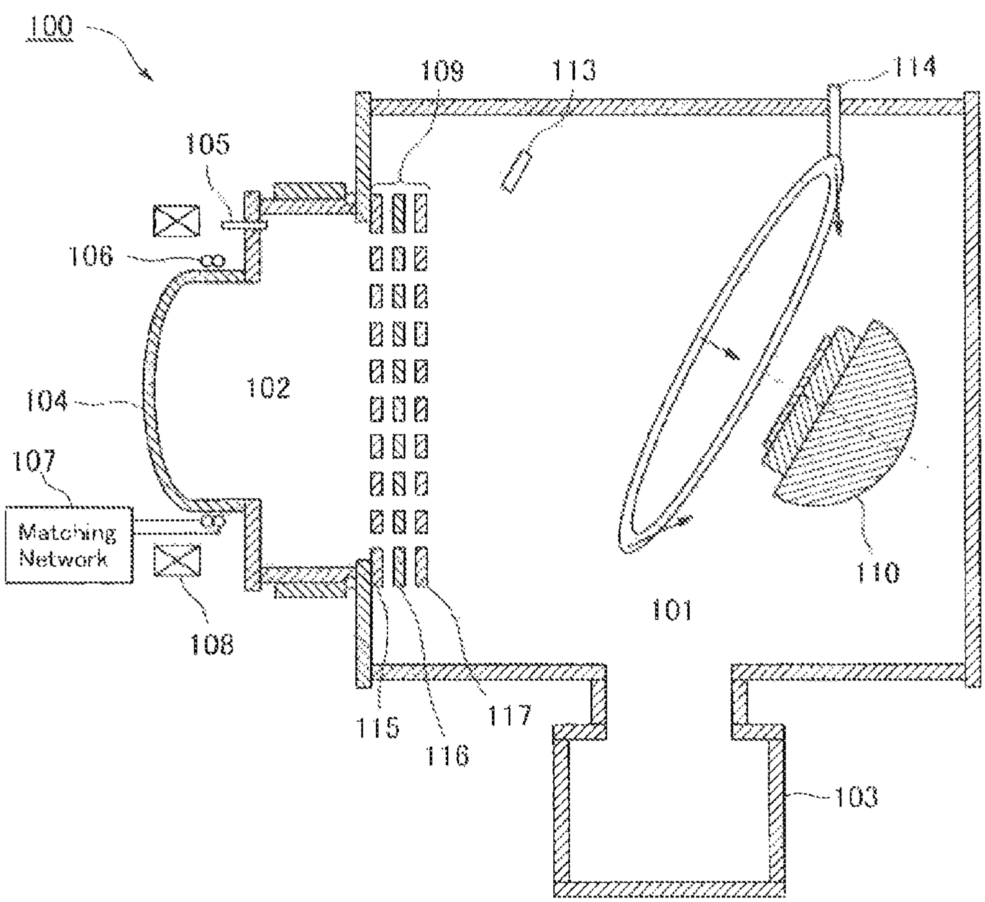
F I G. 3

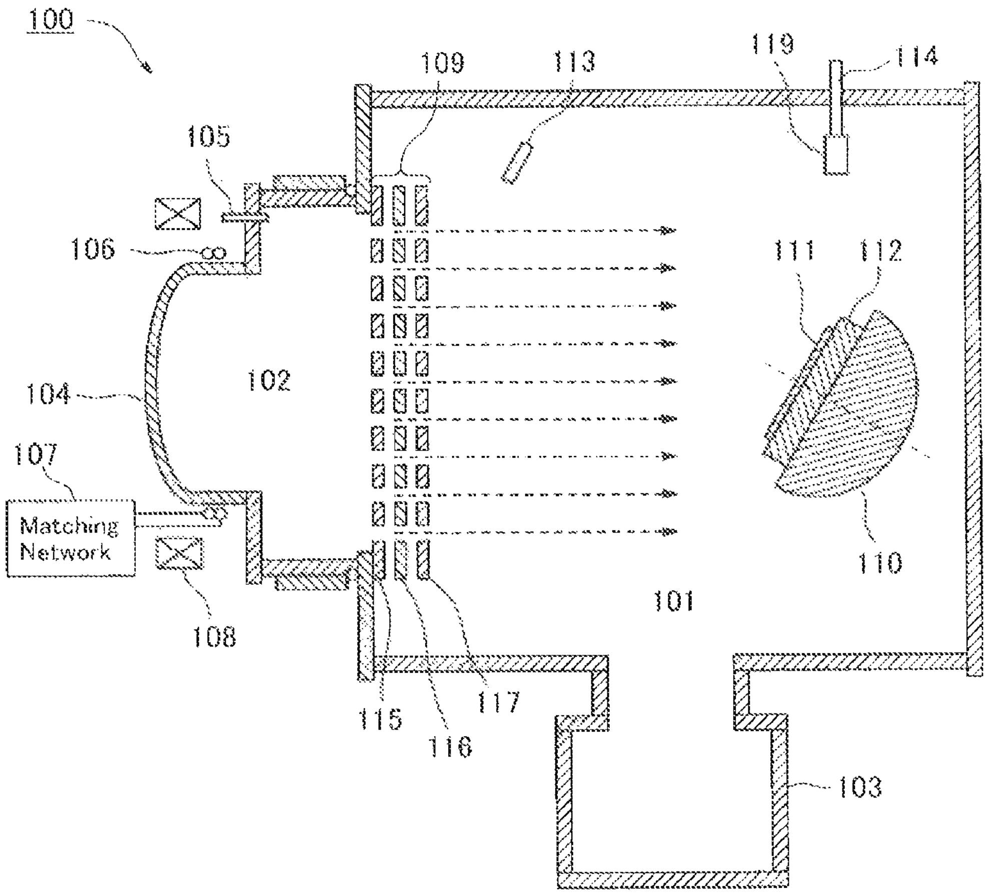
F I G. 4

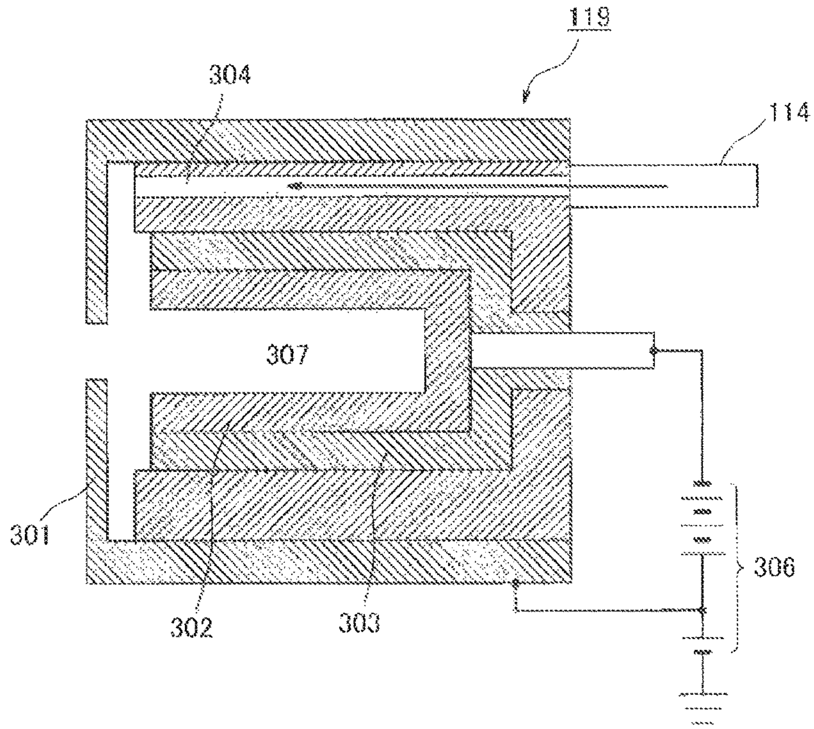
F I G. 5
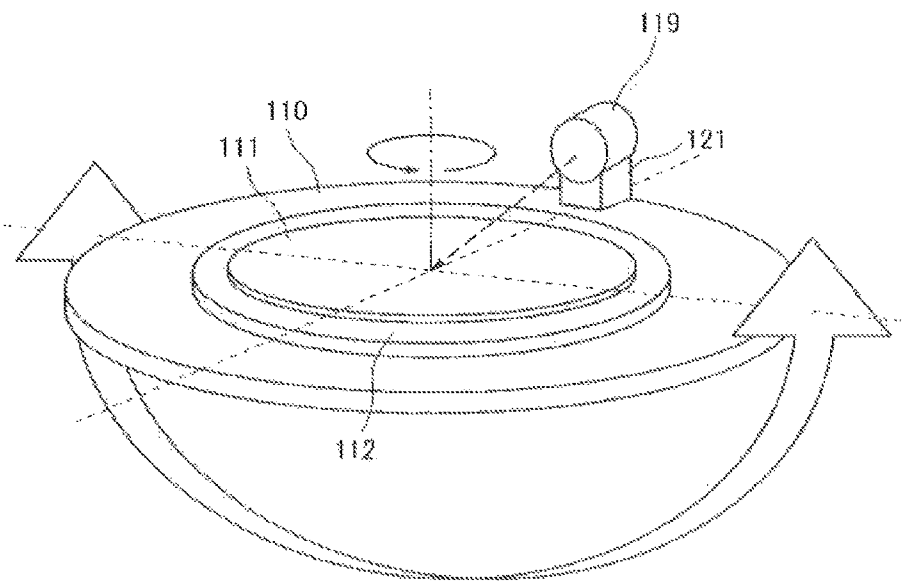
F I G. 6

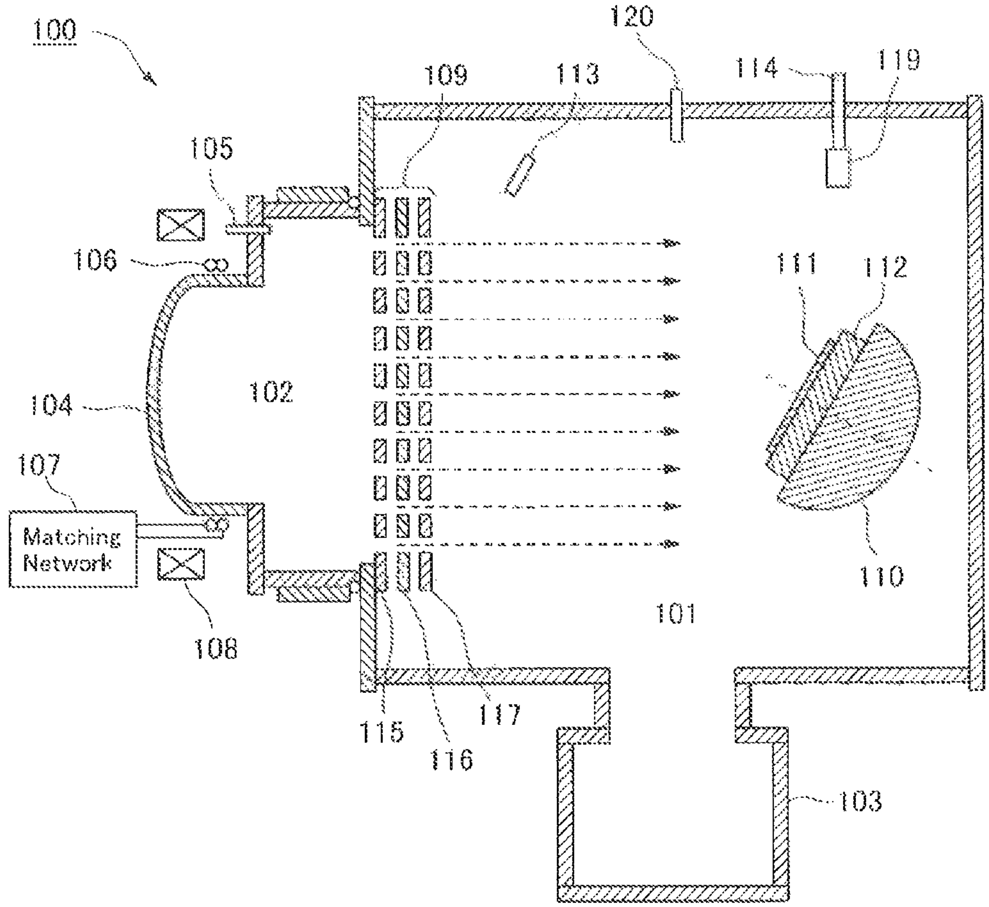
F I G. 7

ION BEAM ETCHING METHOD OF MAGNETIC FILM AND ION BEAM ETCHING APPARATUS

TECHNICAL FIELD

The present invention relates to an ion beam etching method used for etching a magnetic film formed on a substrate and an ion beam etching apparatus used for the method in manufacturing a magnetic device.

BACKGROUND ART

MRAM (Magnetic Random Access Memory) is a non-volatile memory utilizing a magnetoresistive effect such as TMR (Tunneling Magneto Resistive), has as high an integration density as DRAM (Dynamic Random Access Memory) and as much a high-speed performance as SRAM (Static Random Access Memory), and is paid global attention as a revolutionary next-generation memory capable of rewriting data unlimitedly.

An etching technique is typically employed for processing a magnetoresistive effect element contained in MRAM. There is proposed a reactive ion beam etching method using carbon-containing gas such as hydrocarbon in order to efficiently etch a magnetic material such as Co or Fe as an etching material hard to etch in etching a magnetic film of the magnetoresistive effect element (Patent Literature 1).

PRIOR ART REFERENCE

Patent Literature

Patent Literature 1: Japanese Patent Application Laid-Open No. 2005-527101

SUMMARY OF THE INVENTION

Problem to be Solved by the Invention

In the ion beam etching method, however, when carbon-containing gas is used as process gas as described in Patent Literature 1, a large amount of carbon polymers is generated in a plasma generation portion. The large amount of carbon polymers causes a problem such as generation of particles or deterioration in process reproducibility.

The present invention has been made in terms of the problem, and it is an object thereof to provide an ion beam etching method capable of reducing generation of carbon polymers in the plasma generation portion and selectively etching a magnetic film, and an ion beam etching apparatus used for the method.

Means for Solving the Problem

A gist of the present invention is to introduce carbon-containing gas into not only a plasma generation portion but also a substrate processing space in ion beam etching of a magnetic film by use of carbon-containing gas.

That is, in order to solve the above problem, an ion beam etching method of a magnetic film according to the present invention includes steps of:

introducing first carbon-containing gas from a first gas introduction part to generate plasma in an ion beam etching apparatus;

extracting ions from the plasma to form an ion beam; and etching a magnetic film formed on a substrate by the ion beam, wherein second carbon-containing gas is introduced into a processing space in which the substrate is placed from a second gas introduction part different from the first gas introduction part during the etching.

In order to solve the above problem, an ion beam etching apparatus according to the present invention includes:

a plasma generation portion;

a first gas introduction part for introducing gas into the plasma generation portion:

a grid for extracting ions from the plasma generation portion; and a processing space in which a substrate is placed, wherein a second gas introduction part for introducing gas into the processing space is provided, and the grid is made of titanium or titanium carbide or its surface is coated with Ti or titanium carbide.

In order to solve the above problem, an ion beam etching apparatus according to the present invention includes:

a plasma generation portion;

a first gas introduction part for introducing first carbon-containing gas into the plasma generation portion;

a grid for extracting ions from the plasma generation portion; and a processing space in which a substrate is placed, wherein a second gas introduction part for introducing second carbon-containing gas into the processing space is provided.

EFFECTS OF THE INVENTION

According to the present invention, it is possible to selectively etch a magnetic film while restricting generation of particles or deterioration in process reproducibility in ion beam etching of a magnetic film of magnetic devices by reducing generation of carbon polymers in an ion beam etching apparatus.

BRIEF DESCRIPTION OF THE DRAWINGS

FIG. 1 is a diagram for explaining a first embodiment of the present invention.

FIGS. 2A and 2B are diagrams for explaining steps of etching a magnetic film of a magnetoresistive effect element according to the present invention.

FIG. 3 is a diagram for explaining a second embodiment of the present invention.

FIG. 4 is a diagram for explaining a third embodiment of the present invention.

FIG. 5 is a diagram for explaining an ion gun according to the third embodiment of the present invention.

FIG. 6 is a diagram for explaining the third embodiment of the present invention.

FIG. 7 is a diagram for explaining a fourth embodiment of the present invention.

MODE FOR CARRYING OUT THE INVENTION

First Embodiment

Embodiments according to the present invention will be described below with reference to the drawings, but the present invention is not limited to the embodiments, and can be changed as needed without departing from its spirit. The same reference numerals are denoted to members having same function in the drawings described later, and a repeated description thereof may be omitted.

FIG. 1 is a schematic diagram of one embodiment of an ion beam etching apparatus according to the present invention. An ion beam etching apparatus 100 is composed of a processing space 101 and a plasma generation portion 102. The processing space 101 is provided with an exhaust pump 103. The plasma generation portion 102 is provided with a discharge vessel 104, a first gas introduction part 105, a RF antenna 106, a matching unit 107, and an electromagnetic coil 108, and a grid 109 is provided on a boundary with the processing space 101. The plasma generation portion 102 is formed by the grid 109, inner walls of the ion beam etching apparatus 100, and the discharge vessel 104.

The grid 109 is composed of a plurality of electrodes. According to the present invention, the grid 109 consists of three electrodes, for example. First electrode 115, second electrode 116 and third electrode 117 are present in this order from the discharge vessel 104 side. A positive voltage is applied to the first electrode and a negative voltage is applied to the second elect rode so that ions are accelerated due to a difference of their potentials. The third electrode 117 is also called earth electrode, and is grounded. A difference in potentials between the second electrode 116 and the third electrode 117 is controlled, thereby controlling a diameter of an ion beam within a predetermined numerical range by use of an electrostatic lens effect. The ion beam is neutralized by a neutralizer 113.

The grid 109 is preferably made of a material having a resistance to process gas used for the present invention, namely, carbon-containing gas. Molybdenum, titanium or titanium carbide having such a property may be employed. Thus, the grid 109 itself is made of any of molybdenum, titanium or titanium carbide or the surface of the grid 109 is coated with molybdenum, titanium or titanium carbide so that at least the surface of the grid 109 is preferably made of any of molybdenum, titanium or titanium carbide.

The processing space 101 has a substrate holder 110 therein, and a substrate 111 is placed on an electrostatic chuck (ESC) electrode 112. Gas is introduced from the first gas introduction part 105 and a high frequency is applied to the RF antenna 106, thereby generating gas plasma inside the plasma generation portion 102. The first gas introduction part 105 is connected with a pipe (not illustrated), a valve, a flow controller and the like from a tank storing process gas therein (not illustrated), and gas at a predetermined flow rate is introduced into the plasma generation portion 102 through them. A DC voltage is applied to the grid 109, and ions inside the plasma generation portion 102 are extracted as a beam to be irradiated on the substrate 111, so that the substrate 111 is processed. The extracted ion beam is electrically neutralized by the neutralizer 113 to be irradiated on the substrate 111. The processing space 101 is provided with a second gas introduction part 114, through which process gas can be introduced. The substrate holder 110 can be arbitrarily tilted toward an ion beam. The substrate 111 can rotate in the in-plane direction.

A magnetic film of magnetic devices is etched with the ion beam etching method according to the present invention by use of the apparatus illustrated in FIG. 1. FIGS. 2A and 2B schematically illustrate steps of etching a magnetic film of a magnetoresistive effect element with the ion beam etching method.

As illustrated in FIGS. 2A and 2B, a lamination structure with the magnetoresistive effect element according to the present embodiment is such that an underlying layer 23 as a lower electrode is formed on a substrate 24 made of silicon or glass, for example. A multilayer film 22 having a magnetoresistive effect element is formed on the underlying layer 23. A cap layer 21 as an upper electrode is formed on the multilayer film 22. FIGS. 2A and 2B illustrate the states of the cap layer 21 subjected to a patterning process by use of photoresist or the like. A layer above the cap layer 21 is selected as needed by an etching method or an object to be etched.

The underlying layer 23 is processed to a lower electrode in a later step, and thus a conductive material is used therefor. Ta, Ti, Ru or the like may be used as the underlying layer 23.

A multilayer film according to the present embodiment has a basic structure in the magnetoresistive effect element. The basic structure comprises a pair of ferromagnetic layer and non-magnetic intermediate layer, and causes a magnetoresistive effect.

The magnetoresistive effect element having the multilayer film 22 is such that an anti-ferromagnetic layer 224 (PtMn), a magnetization fixed layer 223 (CoFoB), a barrier layer 222 (MgO), and a free layer 221 (CoFeB) are sequentially stacked from below.

The cap layer 21 is used as a hard mask for etching the multilayer film 22. The cap layer 21 according to the present embodiment is used as an upper electrode after the multilayer film 22 is processed, but the upper electrode layer may be provided separately from the hard mask. A monolayer film or a laminated film of Ta, Ti, or a conductive compound thereof such as TaN, TiN, TaC or TiC may be used as the cap layer 21.

In particular, Ta and its compounds are preferable in terms of selection ratio to the multilayer film 22 during ion beam etching.

The multilayer film 22 is etched by use of the ion beam etching method according to the present invention in processing from the state in FIG. 2A to the state in FIG. 2B. Operations of the ion beam etching apparatus at this time will be described with reference to FIG. 1.

At first, first carbon-containing gas is introduced from the first gas introduction part 105 into the discharge vessel 104. As the first carbon-containing gas, carbon monoxide, carbon dioxide, hydrocarbon or alcohol may be used. Gas having less carbons such as methane, ethane, ethylene or acetylene is suitable as hydrocarbon, and lower alcohol such as methanol or ethanol is suitable as alcohol. In particular, alkane such as methane or ethane, or alcohol is more suitable since carbon polymers are less generated. Mixed gas thereof may be used. The first carbon-containing gas may be added with an inert gas such as argon, krypton, xenon or nitrogen, hydrogen, carbon, oxygen, or the like other than the first carbon-containing gas.

The first carbon-containing gas is introduced into the discharge vessel 104 to generate plasma. A voltage is applied to the grid and ions are extracted from the plasma thereby to form an ion beam.

At this time, the amount of the first carbon-containing gas to be introduced is selected in consideration of an exchange frequency of the discharge vessel 104 due to carbon polymers formed inside the discharge vessel 104.

On the other hand, second carbon-containing gas is introduced also from the second gas introduction part 114 provided in the processing space 101. The second gas introduction part 114 is connected with a pipe (not illustrated), a valve, a flow controller, and the like from a tank storing process gas therein (not illustrated), and gas at a predetermined flow rate is introduced into the processing space 101 through them. Carbon monoxide, carbon dioxide, hydrocarbon, or alcohol may be used as the second carbon-containing gas. Gas having less carbons such as methane, ethane, ethylene or acetylene is suitable as hydrocarbon, and lower alcohol such as methanol or ethanol is suitable as alcohol. Mixed gas thereof may be used.

The second carbon-containing gas may be added with an inert gas such as argon, krypton or nitrogen, carbon, oxygen, or the like other than the second carbon-containing gas. The first carbon-containing gas may be the same as the second carbon-containing gas. In this case, an atmosphere inside the ion beam etching apparatus can be made uniform, thereby increasing stability of the process. The same gas supply source (tank) may be used.

The second carbon-containing gas may be introduced after the first gas is introduced and discharged in the plasma generation portion 102 to form an ion beam, or the second carbon-containing gas may be previously introduced into the processing space.

According to the present invention, carbon-containing gas is introduced also into the processing space 101 thereby to promote a reaction between a substrate to be processed and the carbon-containing gas even when the amount of carbon-containing gas to be introduced into the plasma generation portion is reduced. The second carbon-containing gas does not pass through the plasma generation portion 102 when it is supplied to the substrate 111. Consequently, it is possible to process a magnetic film at preferable selection ratio and etching rate while restricting carbon polymers generated in the plasma generation portion. At this time, an electron gun or electron source separate from the neutralizer 113 for neutralizing ion beams is used to introduce electrons or energy into the second carbon-containing gas, thereby enhancing a reactivity.

Alternatively, the substrate 111 is heated by a heater, thereby enhancing a reactivity between the second carbon-containing gas and the reactive ion beam.

Second Embodiment

A second embodiment will be described with reference to FIG. 3.

The present embodiment is different from the first embodiment in the shape of the second gas introduction part 114 in the ion beam etching apparatus 100. As illustrated in FIG. 3, the second gas introduction part 114 according to the present embodiment has a circular injection part, and is configured to inject gas uniformly from the surroundings of a substrate. The substrate surface can be more uniformly processed with such a form.

Third Embodiment

A third embodiment will be described with reference to FIG. 4 to FIG. 6. As illustrated in FIG. 4, an ion gun 119 is provided inside the processing space 101 according to the present embodiment. The ion gun 119 is connected with the second gas introduction part 114, and gas at a predetermined flow rate can be introduced into the ion gun 119.

FIG. 5 is a diagram illustrating an exemplary ion gun 119 according to the present invention.

In FIG. 5, 301 denotes an anode, 302 denotes a cathode and 303 denotes an insulator for insulating the anode 301 from the cathode 302. The cathode 302 is cylindrical, is opened at one end to be opposed to the anode 301, and is closed at the other end. The cathode 302 has a hollow part 307 for forming plasma therein. A cross-section shape of the hollow part of the cathode 302 is typically circular, but may be regular octagonal or regular hexagonal as far as a space capable of forming plasma therein is present. The anode 301 and the cathode 302 are connected to a power supply 306 for applying a predetermined voltage respectively 304 denotes a gas introduction path for introducing discharging gas into a neutralizer, and gas is introduced by the second gas introduction pare 114 into the ion gun 119.

The second gas introduction part 114 may be configured such that gas is directly introduced into the processing space 101 and diffused to be supplied to a discharging part of the ion gun 119, but the substrate 111 can be processed without lowering a degree of vacuum in the processing space 101 when gas is directly introduced into the ion gun 119.

Further, the ion guns 119 are symmetrically arranged about the center axis of the substrate 111 in the processing space 101 so that the substrate 111 can be more uniformly etched.

Gas is introduced into the ion gun 119 and a negative voltage is applied to the cathode 302 so that plasma is formed in the hollow part 307. Further, a positive voltage is applied to the anode 301 so that negative ions are extracted from the opening of the anode 301.

Mixed gas of inert gas and carbon-containing gas is preferable as gas to be introduced into the ion gun 119 in order to restrict a film from being deposited in the ion gun 119.

There will be assumed a case in which mixed gas of Ar and methane is introduced into the ion gun 119 by way of example. In this case, plasma is formed near the cathode 302 and various negative ions such as $CH^{3-}$ and $CH_2^{2-}$ are generated from the plasma. Then, the negative ions are accelerated due to a potential difference between the cathode 302 and the anode 301, and are extracted from the opening of the anode 301.

As gas to be introduced into the ion gun 119, carbon monoxide, carbon dioxide, hydrocarbon, or alcohol may be used as in other embodiments.

Titanium is used as the anode 301 and the cathode 302 in consideration of heat resistance or anti-spattering property, for example. The material may be changed in consideration of a reactivity with gas to be introduced into the ion gun 119.

The ion gun 119 may employ other form, not limited to the above structure. For example, the anode 301 and the cathode 302 may be inversely configured to extract positive ions. Plasma may be formed by use of any other than hollow type electrode.

The substrate holder 110 can be tilted at an arbitrary angle toward the grid 109. The amount of ions to be irradiated on the substrate 111 from the ion gun 119 changes due to a position of the ion gun 119 and a tilt angle of the substrate 111. The amount of irradiated ions also changes at each point in the substrate 111.

In this viewpoint, as illustrated in FIG. 6, a placement table 121 is provided on the substrate holder 110 and the ion gun 119 is provided on the placement table 121 to integrate the substrate holder 110 and the ion gun 119 so that even when a tilt angle of the substrate 111 changes, a change of the amount of irradiated ions from the ion gun 119 can be reduced.

Even if the substrate holder 110 and the ion gun 119 are not integrated, the ion gun 119 is provided around the rotation axis when a tilt angle of the substrate holder 110 is changed, so that also when a tilt angle of the substrate 111 changes, a change of the amount of irradiated ions from the ion gun 119 can be reduced.

Alternatively, when the ion gun 119 is placed on the substrate holder 110 to be tilted integral with the substrate 111, the amount of irradiated ions can be constant irrespective of the tilt angle of the substrate 111. At this time, a spacer may be provided as needed between the substrate holder 110 and the ion gun 119 in order to optimize an angle at which ions are irradiated onto the substrate 111.

Fourth Embodiment

As illustrated in FIG. 7, a third gas introduction part 120 may be provided in addition to the second gas introduction part 114 and the ion gun 119 to introduce third carbon-containing gas. With the structure, even when the amount of second carbon-containing gas to be introduced into the ion gun 119 from the second gas introduction part 114 is reduced, a reduction in reactivity can be restricted. The amount of carbon-containing gas to be introduced into the ion gun 119 can be reduced, and thus the substrate 111 can be processed while the amount of carbon polymers to be formed in the ion gun 119 is reduced.

Carbon monoxide, carbon dioxide, hydrocarbon, or alcohol is used as the third carbon-containing gas. Gas having less carbons such as methane, ethane, ethylene or acetylene is suitable as hydrocarbon, and lower alcohol such as methanol or ethanol is suitable as alcohol. In particular, alkane such as methane or ethane, or alcohol is more suitable since carbon polymers are less generated. Mixed gas thereof may be employed. The third carbon-containing gas may be added with an inert gas such as argon, krypton, xenon or nitrogen, hydrogen, carbon, oxygen, or the like other than the third carbon-containing gas.

As described above, according to the present invention, the second carbon-containing gas is introduced also into the processing space 101 in addition to the first carbon-containing gas to be introduced into the discharge vessel 104. Thus, also when the amount of carbon-containing gas to be introduced into the discharge vessel 104 is reduced, the multilayer film 22 can be selectively etched with respect to the cap layer 21, and generation of carbon polymers in the discharge vessel 104 can be reduced.

Etching a magnetic film of a magnetoresistive effect element has been described according to the above embodiments, but the present invention is effective also in etching a magnetic film of other magnetic device. A specific example is to etch a magnetic film for forming a write part of a magnetic head or to etch a magnetic film for manufacturing a magnetic recording medium such as DTM (Discrete Track Media) and BPM (Bit Patterned Media).

EXPLANATION OF REFERENCE NUMERALS

21: Cap layer, 22: Multilayer film, 23: Underlying layer, 24: Substrate, 100: Ion beam etching apparatus, 101: Processing space, 102: Plasma generation portion, 103: Exhaust pump, 104: Discharge vessel, 105: First gas introduction part, 106: RF antenna, 107: Matching unit, 108: Electromagnetic coil, 109: Grid, 110: Substrate holder, 111: Substrate, 112: ESC electrode, 113: Neutralizer, 114: Second gas introduction part, 115: First electrode, 116: Second electrode, 117: Third electrode, 119: Ion gun, 120: Third gas introduction part, 121: Placement table, 221: Free layer, 222: Barrier layer, 223: Magnetization fixed layer, 224: Antiferromagnetic layer, 301: Anode, 302: Cathode, 303: Insulator, 304: Gas introduction path, 306: Power supply

The invention claimed is:

1. An ion beam etching method of a magnetic film using an ion beam etching apparatus which has a discharge vessel and an RF antenna comprising a coil comprising steps of:

introducing a first carbon-containing gas from a first gas introduction part formed in the discharge vessel to a plasma generation portion of an ion beam etching apparatus;

applying a high frequency to the RF antenna, thereby generating gas plasma inside the plasma generation portion;

extracting ions from the plasma to form an ion beam; and etching a magnetic film of a magnetoresistive effect element formed on a substrate by the ion beam, wherein the etching includes (a) a first process of introducing the first carbon-containing gas in an amount selected based on an exchange frequency of the discharge vessel caused by carbon polymers formed in the discharge vessel into the plasma generation portion from the first gas introduction part provided in the plasma generation portion, generating the gas plasma inside the plasma generation portion and extracting ions from the plasma in the plasma generation portion in which the plasma is generated to form the ion beam by a grid provided on the boundary between the plasma generation portion and a processing space in which the substrate is placed, and after the first process, (b) a second process of introducing a second carbon-containing gas into the processing space in which the plasma is not generated from a second gas introduction part provided in the processing space which is separated from the plasma generation portion by the grid, and wherein, during the etching, the magnetic film formed on the substrate is etched by the ion beam formed in the first process and the second carbon-containing gas.

2. The ion beam etching method of a magnetic film according to claim 1, wherein the first carbon-containing gas is any of carbon dioxide, carbon monoxide, hydrocarbon and alcohol, or mixed gas thereof, and the second carbon-containing gas is any of carbon dioxide, carbon monoxide, hydrocarbon and alcohol, or mixed gas thereof.

3. The ion beam etching method of a magnetic film according to claim 1 or 2, wherein the first carbon-containing gas is the same as the second carbon-containing gas.

4. The ion beam etching method of a magnetic film according to claim 1, wherein third carbon-containing gas is introduced into the processing space from a third gas introduction part different from the first and second gas introduction parts during the etching.

5. The ion beam etching method of a magnetic film according to claim 1, wherein the plasma generation portion is contained within a discharge vessel, and the RF antenna is provided outside a side wall of the discharge vessel.

6. An ion beam etching method of a magnetic film using an ion beam etching apparatus which has a discharge vessel and an RF antenna comprising a coil comprising steps of:

introducing a first carbon-containing gas from a first gas introduction part formed in the discharge vessel to a plasma generation portion of an ion beam etching apparatus;

applying a high frequency to the RF antenna, thereby generating gas plasma inside the plasma generation portion;

extracting ions from the plasma to form an ion beam; and etching a magnetic film of a magnetoresistive effect element formed on a substrate by the ion beam, wherein the etching includes (a) a first process of introducing a second carbon-containing gas into a processing space from a second gas introduction part which is different from the first gas introduction part and provided in the processing space in which the plasma is not generated by separating the plasma generation portion and the processing space with a grid provided on the boundary between the plasma generation portion and the processing space in which the substrate is placed, and after the first process, (b) a second process of introducing the first carbon-containing gas in an amount selected based on an exchange frequency of the discharge vessel caused by carbon polymers formed in the discharge vessel into the plasma generation portion from the first gas introduction part provided in the plasma generation portion, and wherein during the second process, the gas plasma is generated in the plasma generation portion, the ion beam is formed by extracting ions from the plasma generated in the plasma generation portion, and the magnetic film formed on the substrate is etched by the ion beam and the second carbon-containing gas.

* * * * *